United States Patent
Jacunski et al.

(10) Patent No.: US 6,580,655 B2
(45) Date of Patent: Jun. 17, 2003

(54) PRE-CHARGE CIRCUIT AND METHOD FOR MEMORY DEVICES WITH SHARED SENSE AMPLIFIERS

(75) Inventors: Mark D. Jacunski, Colchester, VT (US); Michael A. Killian, Richmond, VT (US)

(73) Assignees: International Business Machines Corporation, Armonk, NY (US); Infineon Technologies North America Corp., San Jose, CA (US)

(*) Notice: Subject to any disclaimer, the term of this patent is extended or adjusted under 35 U.S.C. 154(b) by 0 days.

(21) Appl. No.: 09/941,911

(22) Filed: Aug. 29, 2001

(65) Prior Publication Data

US 2003/0043666 A1 Mar. 6, 2003

(51) Int. Cl.$^7$ .................................................. G11C 8/00
(52) U.S. Cl. .................. 365/230.03; 365/203; 365/205; 365/230.06
(58) Field of Search ....................... 365/230.03, 230.06, 365/203, 189.01, 230.01, 205

(56) References Cited

U.S. PATENT DOCUMENTS

| | | |
|---|---|---|
| 4,982,370 A | 1/1991 | Matsumoto et al. |
| 5,202,855 A | 4/1993 | Morton |
| 5,267,214 A | 11/1993 | Fujishima et al. |
| 5,396,465 A | 3/1995 | Oh et al. |
| 5,444,662 A | 8/1995 | Tanaka et al. |
| 5,553,028 A * | 9/1996 | McLaury ..................... 365/205 |
| 5,563,831 A | 10/1996 | Ting |
| 5,862,089 A * | 1/1999 | Raad et al. .................. 365/203 |
| 5,875,141 A * | 2/1999 | Shirley et al. .............. 365/190 |
| 6,023,437 A * | 2/2000 | Lee ............................ 365/202 |
| 6,049,493 A * | 4/2000 | Kitamoto et al. ........... 365/203 |

* cited by examiner

*Primary Examiner*—Hoai Ho
(74) *Attorney, Agent, or Firm*—DeLio & Peterson, LLC; Peter W. Peterson; N. Daniel Schnurmann

(57) ABSTRACT

A pre-charge circuit for a memory device having a sense amplifier shared between right and left banks of memory cells and a method of pre-charging the shared sense amplifier. The circuit is operated according to the method of the invention such that the sense amplifier is always pre-charged from the side that was previously active. The circuit includes right and left bank isolation transistor pairs connected between the shared sense amplifiers and the right and left banks. The isolation transistor pairs are controlled by a flip flop having a left bank state and a right bank state and complementary left and right outputs that turn off the left isolation transistor pair and turn on the right pair during row operations to the right and vice-versa. The flip-flop is kept in the right bank state after a row operation to the right bank so that the sense amplifier is pre-charged from the right after row operations to the right and the flip-flop is kept in the left bank state after a row operation to the left so that the sense amplifier is pre-charged from the left after row operations to the left.

13 Claims, 4 Drawing Sheets

PRE-CHARGE CIRCUIT AND METHOD FOR MEMORY DEVICES WITH SHARED SENSE AMPLIFIERS

BACKGROUND OF THE INVENTION

1. Field of the Invention

The present invention relates to semiconductor memory devices, such as dynamic random access memory (DRAM), that use sense amplifiers shared between right and left arrays of memory cells and connected to those arrays through isolation transistors. More specifically, the present invention relates to the circuit that controls the isolation transistors during pre-charging and to the method of pre-charging the shared sense amplifier in such memory devices.

2. Description of Related Art

Memory devices designed with shared sense amplifiers have two bitline pairs that are typically located on opposite (left and right) sides of the sense amplifier they share. Before a memory cell can be accessed, the bank containing that cell must be activated. To access the left bank of memory cells, the sense amplifier is connected to the left side bitline pair through a corresponding pair of left side isolation transistors. As the left side isolation transistors are turned on, the sense amplifier is simultaneously disconnected from the unused right side bitline pair by turning off isolation transistors on the right side. To access a memory cell in the right bank the opposite occurs: the right side isolation transistors are turned on and the left side isolation transistors are turned off.

Each time a new bank is to be accessed, a bank activation command is issued to select a new row of cells and start a new row cycle. Between each row cycle the shared sense amplifier must be pre-charged through the bitlines to an equalization voltage (intermediate between the high and low voltage states). A conventional design for the circuit used to control the isolation transistors during pre-charging (the pre-charge circuit) simultaneously turns on the isolation transistor pairs on both sides of the shared sense amplifier.

This conventional pre-charge circuit design has a significant disadvantage, however, in that a pre-charge failure on either side of the sense amplifier may cause a failure on the opposite side due to the simultaneous connection of both sides to the sense amplifier. For example, if a wordline on one side of the sense amplifier is shorted to a bitline on that side, this conventional pre-charge circuit design causes a reduction in the equalization voltage on the opposite side of the sense amplifier as well as on the failed side. This reduction in equalization voltage causes the opposite side to fail, resulting in two failures as a result of the single defect.

An improved pre-charge circuit is presently in use in which the sense amplifier is pre-charged to the equalization voltage from only one side. The choice of the side to use for pre-charging is arbitrary because the location of any defect is unknown. Approximately half of the time, the location of the defect will be on the opposite side of the sense amplifier from the side that is used for pre-charging, allowing the pre-charge side to operate correctly without being affected by the defect.

This improved pre-charge design has heretofore always been implemented by pre-charging the sense amplifier from the same pre-selected side (the pre-charge side) between each row cycle. For the case in which the previous row operation took place on the pre-charge side of the sense amplifier, the two pairs of isolation transistors will already be in the correct state (pre-charge side on and non-pre-charge side off) for pre-charging. However, after a row operation to the non-pre-charge side, all four of the isolation transistors must change state to disconnect the bitline pair from the non-pre-charge side and connect the bitline pair on the pre-charge side.

If the non-pre-charge side is to be accessed a second time, the four isolation transistors must be switched yet again to reconnect the non-pre-charge side to the sense amplifier. The isolation transistors must be switched at the proper time and in the proper sequence relative to the other memory control signals to connect the sense amplifier to the pre-charge side before pre-charging. Switching the isolation transistors after each row operation to the non-pre-charge side, and the necessity to fit this timing event into the other timing events related to the row cycle lengthens the duration of each row cycle. It would be desirable to be able to eliminate this pre-charge timing event.

A more significant problem, however, relates to the difficulty in turning off the isolation transistors on the low bitline on the non-pre-charge side after a row operation to that side. The isolation transistors on the pre-charge side and the isolation transistor on the high bitline on the non-pre-charge side all switch quickly. However, after a row operation to the non-pre-charge side, the transistor on the low bitline on that side does not turn off until the isolator transistors on the pre-charge side begin to turn on.

During this period, charge leaks onto the low bitline, raising it above its initial low voltage level. During equalization, the two bitlines on the non-pre-charge side are connected and the charge on the low bitline is shared with the high bitline, resulting in the bitline pair on the non-pre-charge side having a higher voltage than the desired midpoint equalization voltage. This offset from the intended equalization voltage is undesirable and can result in read errors.

Bearing in mind the problems and deficiencies of the prior art, it is therefore an object of the present invention to provide a pre-charge circuit for use in shared sense amplifier memory devices that includes the advantages of prior art improved pre-charge circuit designs relative to defects, but which also eliminates the equalization problem described above.

It is another object of the present invention to provide a pre-charge circuit for use in shared sense amplifier memory devices that eliminates one timing event during the pre-charge cycle.

It is a further object to simplify the circuit controlling the isolation transistors during pre-charge and memory bank activation.

Still other objects and advantages of the invention will in part be obvious and will in part be apparent from the specification.

SUMMARY OF THE INVENTION

The present invention is directed to a new pre-charge circuit design and a new method of controlling the isolation transistors during pre-charging of a shared sense amplifier. It is based upon the recognition that the sense amplifier can be pre-charged from either side, and it is not necessary to pre-charge from the same side every time.

The equalization problem discussed above only occurs when pre-charging from the side opposite the previous row operation. It is possible to always pre-charge from the side used in the previous row operation, thereby eliminating the equalization problem discussed above. This has the additional substantial advantage that the isolation transistors are automatically in the correct state for pre-charging. They do not have to be switched to a predetermined state for pre-charging.

Consequently, it is not necessary to wait for the isolation transistors to switch prior to pre-charging. Because there is no timing event related to switching the isolation transistors for pre-charging, and no timing tolerance is required for this event, subsequent timing events can begin sooner, thereby improving performance.

The present invention is directed to, in a first aspect, a pre-charge circuit for a memory device having a sense amplifier shared between a right bank during row operations to the right bank and a left bank during row operations to the left bank. Right and left bank isolation transistor pairs are connected between the sense amplifier and the right and left banks, respectively. Corresponding right and left bank isolation control lines are used to control the right and left bank isolation transistor pairs. The right and left bank isolation control lines are switchable by the memory device between on and off states to turn the isolation transistor pairs on and off.

A flip-flop, switchable between a right bank state and a left bank state, includes a right bank isolation output connected to the right bank isolation control line and a left bank isolation output connected to the left bank isolation control line. The right bank isolation output is in the on state and turns on the right bank isolation transistor pair when the flip-flop is in the right bank state. The right bank isolation output switches to the off state and turns off the right bank isolation transistor pair when the flip-flop is in the left bank state.

The left bank isolation output is connected to the left bank isolation control line. It switches to the on state to turn on the left bank isolation transistor pair when the flip-flop is in the left bank state. It switches to the off state and turns off the left bank isolation transistor pair when the flip-flop is in the right bank state. The memory device switches the flip-flop to the right bank state prior to right bank row operations and to the left bank state prior to left bank row operations. The flip flop remains in the right bank state to pre-charge the sense amplifier from the right bank after right bank row operations and remains in the left bank state to pre-charge the sense amplifier from the left bank after left bank row operations.

The invention is also directed to a method of pre-charging a shared sense amplifier. The method includes the steps of:

connecting the sense amplifier to the right bank prior to row operations to the right bank;

pre-charging the sense amplifier from the right bank after row operations to the right bank;

connecting the sense amplifier to the left bank prior to row operations to the left bank; and pre-charging the sense amplifier from the left bank after row operations to the left bank.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
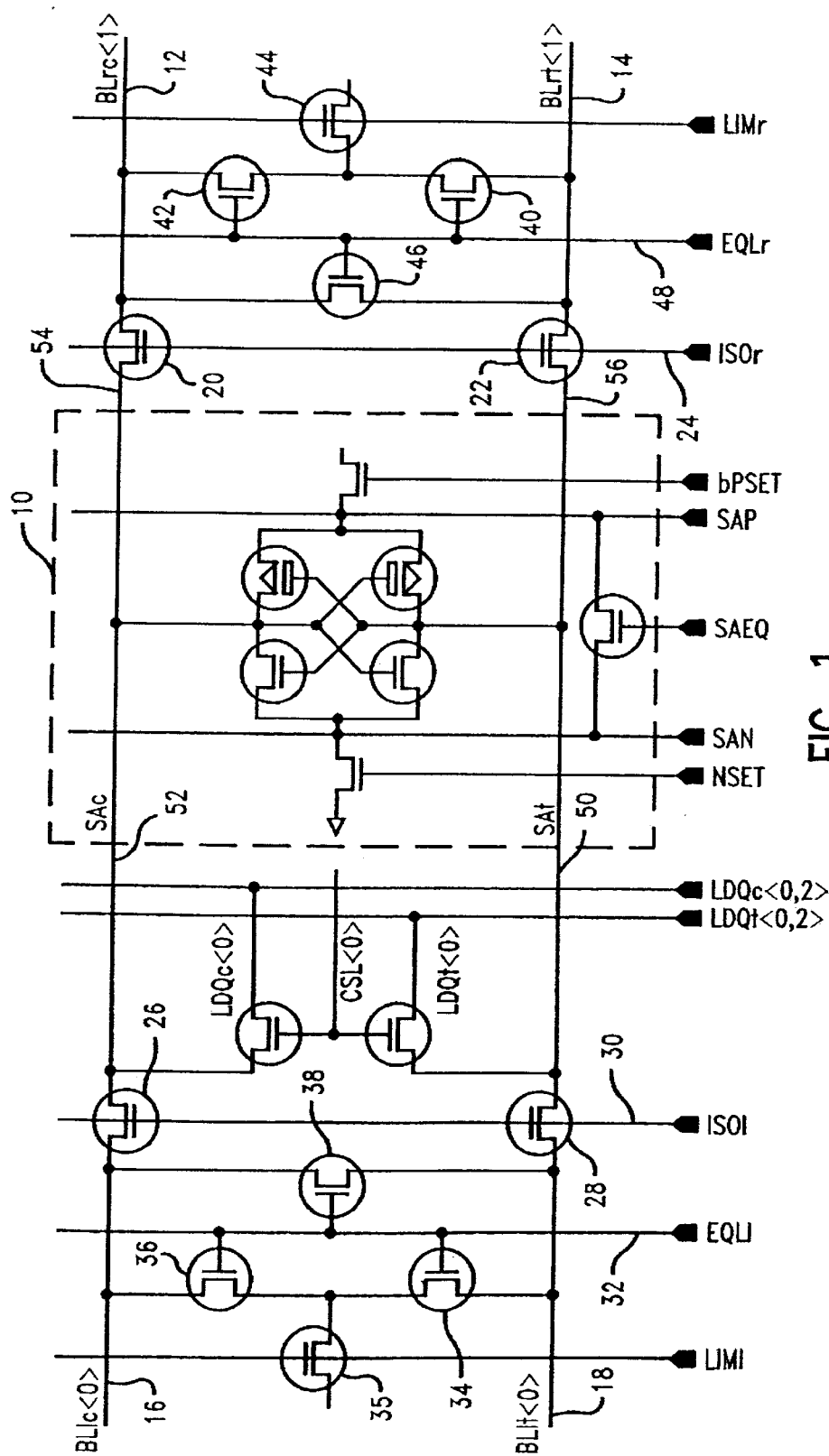
FIG. 1 is a schematic of a prior art shared sense amplifier circuit.

In describing the preferred embodiment of the present invention, reference will be made herein to FIGS. 1–4 of the drawings in which like numerals refer to like features of the invention. Features of the invention are not necessarily shown to scale in the drawings.

Figure 2:
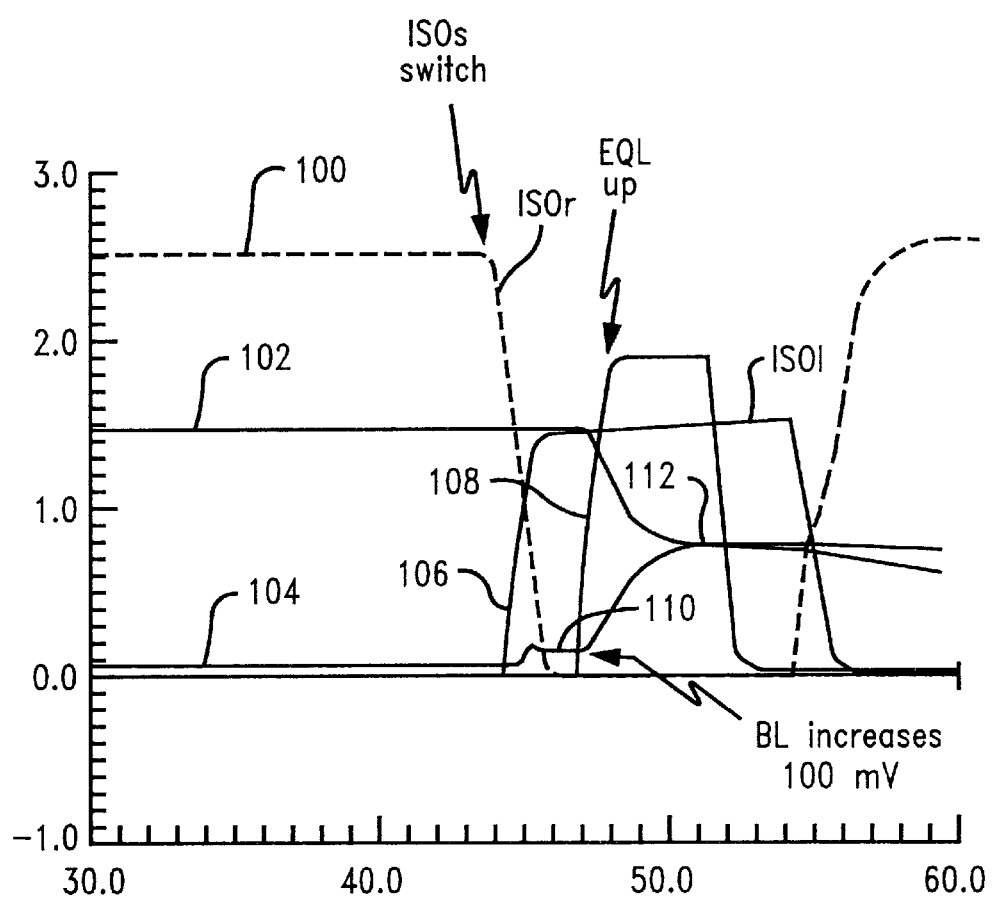
FIG. 2 is a graph showing voltage levels during operation of a prior art shared sense amplifier circuit when switched with a prior art pre-charge circuit after a row operation to the non-pre-charge bank of the shared sense amplifier circuit in FIG. 1.

The present invention will best be understood by reference to FIGS. 1 and 2. FIG. 1 shows a typical shared sense amplifier and associated circuitry in a memory device having a shared sense amplifier. The pre-charge circuit of the present invention can be used to control the memory device shown in FIG. 1. FIG. 2 shows the equalization problem described above when the circuit in FIG. 1 is controlled according to the method of the prior art.

Referring to FIG. 1, the sense amplifier 10 is shared by arrays of memory cells located on the right and on the left. The right bank of memory cells is connected to the sense amplifier 10 with a pair of right bitlines 12 and 14. The sense amplifier is connected to the left bank of memory cells through bitlines 16 and 18.

The sense amplifier 10 can be connected to or disconnected from the right bank by a pair of right bank isolation transistors 20, 22. When isolation transistor 20 is turned on, the sense amplifier 10 is connected to right bitline 12. When isolation transistor 22 is turned on, the sense amplifier is connected to the right bitline 14.

The gates of the right isolation transistors 20, 22 are connected together and to control line 24 (ISOr) such that they switch together under the ISOr control signal command to connect or disconnect the sense amplifier 10 from the right bank of memory cells. In a similar manner, the left bank is connected to or disconnected from the sense amplifier with left bank isolation transistors 26, 28 which are controlled by control line 30 (ISOL).

The sense amplifier 10 can be pre-charged from the left side under the control of the left equalization control line 32 (EQLL) which turns on transistors 34 and 36 to connect the left bitline 16, 18 to the equalization voltage through transistor 35, and also turns on transistor 38 to connect left bitline 16 to left bitline 18. When pre-charging from the left side, the ISOL control line 30 must also be high to connect the left bitlines 16 and 18 to the sense amplifier 10.

Alternatively, the sense amplifier can be pre-charged from the right side by turning on transistors 40 and 42 to connect the right bitlines 12 and 14 to the equalization voltage supplied at their midpoint by transistor 44 and by turning on transistor 46 which connects the right bitlines 12 and 14 together.

As previously described, the prior art method of pre-charging has been to pre-charge from either both sides simultaneously or from a predefined side. FIG. 2 illustrates the equalization problem that occurs after a row operation to the right side when the predefined pre-charge side is the left side. A similar equalization problem would occur if the predefined pre-charge side were the right side after an operation to the left side.

Referring to FIG. 2, voltage is plotted on the vertical axis and time is plotted on the horizontal axis. Multiple different signals from FIG. 1 are shown during the prior art pre-charge operation. At the start time (T=30), the right bank is active and the voltage on the ISOr control line 24 is high as indicated with curve 100. The voltage on the ISOL control line 30 is low as shown by curve 106. Accordingly, the sense amplifier 10 is connected to the right bitlines 12, 14 and is disconnected from the left bitlines 16, 18.

The voltage on the right bitline 12 is high as indicated by curve 102 while the voltage on the right bitline 14 is low as indicated by curve 104. At approximately time T=44, the prior art method of pre-charging brings the ISOr control line low to disconnect the right bitlines 12 and 14. Simultaneously, ISOL is brought high as shown by curve 106 to connect the sense amp 10 to the left bitlines 16 and 18 for pre-charging.

Although ISOr is low, it fails to immediately turn off transistor 22. There is insufficient voltage differential between the source and drain of isolation transistor 22 and its gate, which is connected to ISOr. Isolation transistor 22 does not turn off until the left isolation transistors 26 and 28 have begun to turn on due to the rising ISOL voltage (curve 106), which turns on the left isolation transistors. As a result, the voltage on the low bitline 14 on the non-pre-charge side (right side) begins to rise at about the same time (T=44) as the ISOs switch as indicated by curve 104 in the region marked with reference number 110. In the example shown, the highlighting arrow indicates an approximate 100 millivolt increase on bitline (BL) 14.

At approximately time T=47 the voltage on the EQLr control line 48 is brought high as indicated by curve 108. This causes the voltage on the high bitline 12 to drop as shown by curve 102. The voltage on the low bitline 14 begins to climb as indicated by curve 104. They reach a voltage midway between them at approximately time T=50. However this voltage is approximately 50 millivolts higher than the desired equalization voltage due to the charge sharing between the two bitlines. At approximately time T=55, ISOL and ISOr change state again in order to access the right bitlines 12, 14 for the next row operation.

The 100 millivolt voltage increase at point 110 and the 50 millivolt increase at point 112 are caused by the failure of transistor 22 to turn off immediately as the ISOs switch. As ISOr goes down, the isolator FET 20 on the high bitline turns off quickly because its source and drain are at a relatively high voltage compared to the voltage on ISOr, which is dropping quickly toward zero. However, the right isolator FET 22 on the low bitline has its source and drain at a relatively low voltage and does not turn off immediately as its gate, which is connected to ISOr drops towards zero.

FET 22 does not actually turn off until the left isolator transistors 26 and 28 begin to turn on increasing the voltage on bitlines 16 and 18 and the voltage on the sense amplifier nodes 50, 52, 54 and 56. The 50 millivolt increase above the desired equalization voltage at point 112 results in a loss to a physical 1 s signal of 50 millivolts times the transfer ratio. The transfer ratio is typically in the vicinity of 20% resulting in a 10 millivolt loss.

The equalization problem illustrated in FIG. 2 occurs during pre-charge from the left after each row operation to the right side.

Figure 3:
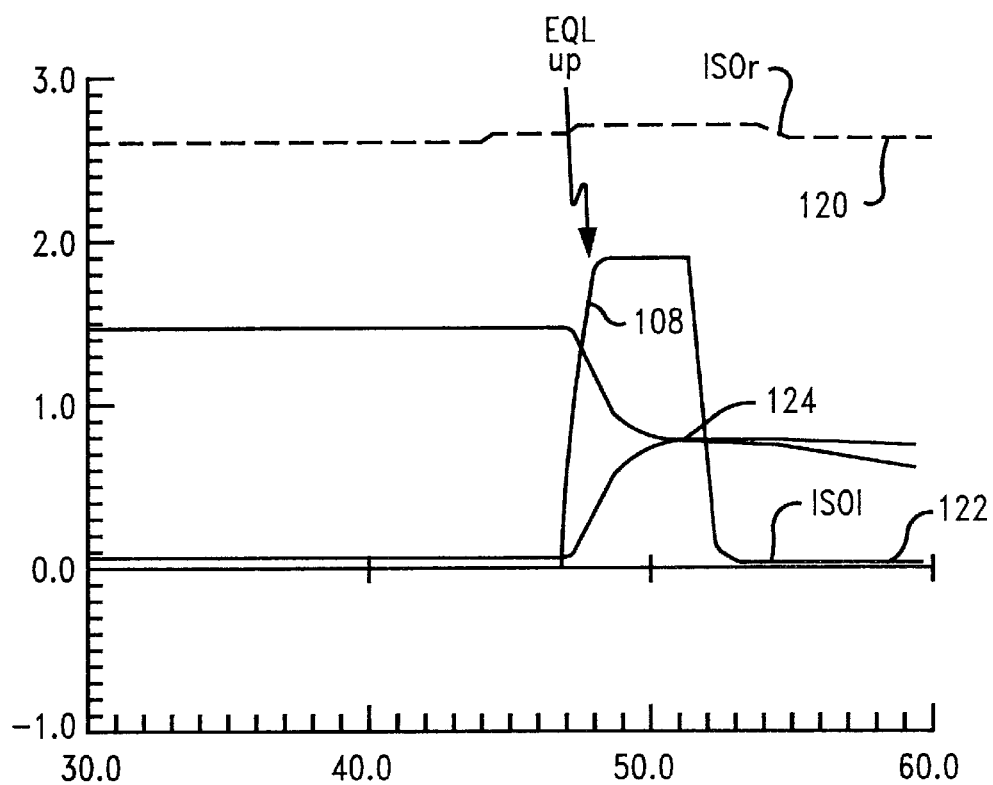
FIG. 3 is a graph showing voltage levels during operation of a prior art shared sense amplifier circuit when switched with the pre-charge circuit of the present invention according to the method of this invention after a row operation to the non-pre-charge bank of the shared sense amplifier circuit in FIG. 1.

The present invention completely avoids this equalization problem by always pre-charging from the side previously activated by a bank activation command. FIG. 3 illustrates this new method of pre-charging. At time T=30 in FIG. 3, the right bank is active with ISOr 120 high and ISO 122 low. At time T=45, in the prior art design the ISOs would switch in order to begin pre-charging from the left. However, in the method of operation of the present invention, pre-charging is completed from the same side as the side used in the previous row operation. Accordingly, ISOr remains high and ISOL remains low. If the left bank was previously active then ISOL would have been low and ISOr high during the left bank access and during the subsequent pre-charge.

Because the isolation transistor never have to be switched for pre-charging, the entire timing event related to the switching of the ISOs for pre-charge is eliminated. At approximately time T=47 the voltage on EQLr (control line 48 in FIG. 1) is raised and the sense amplifier 10 is pre-charged from the right side such that at point 124 (approximately T=51) the sense amplifier 10 has been pre-charged through right nodes 54 and 56 to the desired equalization voltage without the offset described in connection with the equalization problem of FIG. 2.

Following a row operation to the left side, ISOL will be high and ISOr will be low and pre-charging of the sense amplifier will be completed from the left side.

Those of skill in the art will recognize that the timing event related to turning on EQLL and EQLr and transistors 38 and 40 is typically preceded by a timing event changing the state of the word line and the set lines NSET and bPSET in FIG. 1. Because the timing event for switching the ISOs for pre-charge shown in FIG. 2 can be eliminated, the timing tolerances for the "EQL up" event can be tightened and the cycle time shortened.

Figure 4:
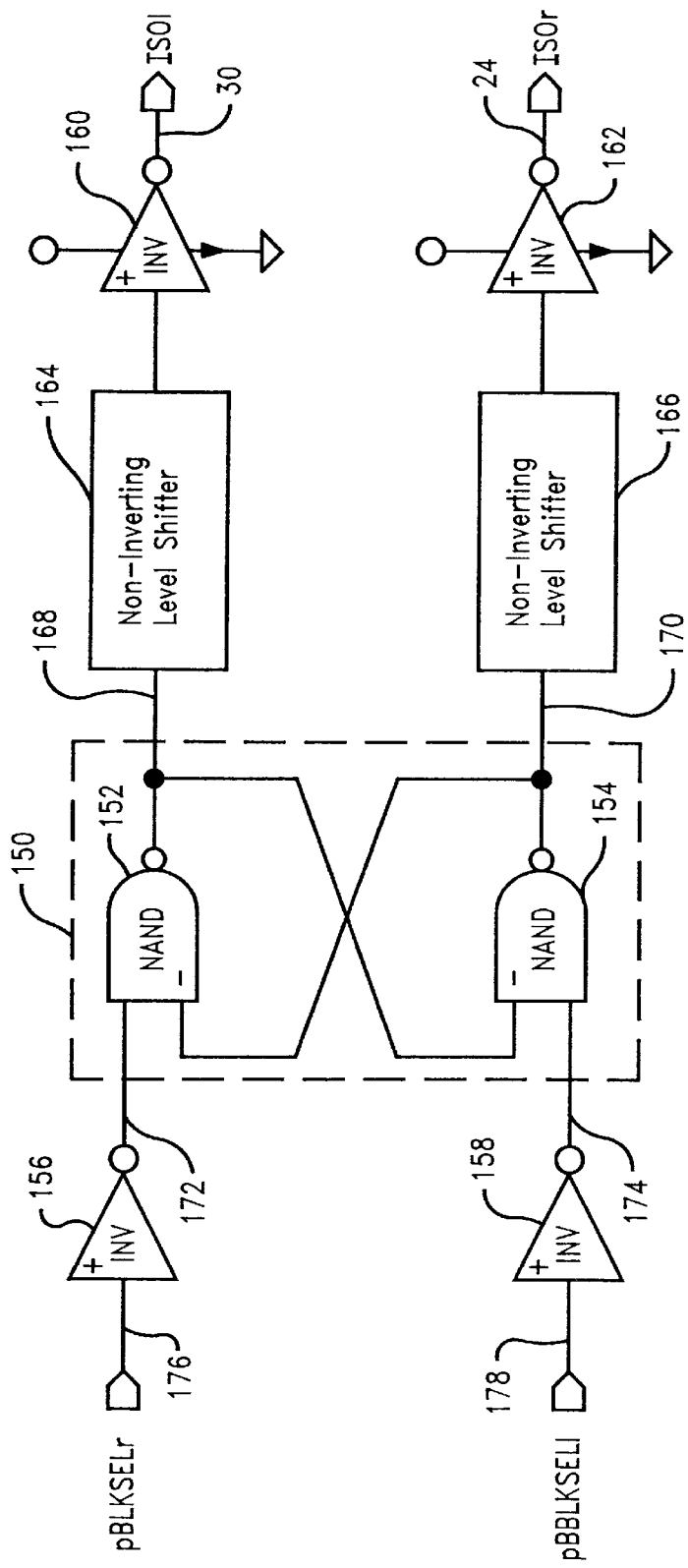
FIG. 4 is a preferred embodiment of a pre-charge circuit constructed according to the present invention.

FIG. 4 shows a preferred embodiment of the present invention in which a flip-flop 150 formed from two nand gates 152 and 154 is used to control the state of the ISOL and ISOr control line 30 and 24. Inverting buffers 156 and 158 are provided at the inputs of flip-flop 150. The outputs of the flip-flop 168, 170 are connected to ISOL and ISOr through two inverting buffers 164 and 166.

Outputs 168 and 170 are always in the opposite state and always keep ISOL and ISOr in opposite states. The inputs to the flip-flop 172, 174 are connected through buffers 156 and 158 respectively to right and left block select control lines pBLKSELr 176 and pBLKSEL1 178. Prior to a bank activation, the flip-flop 150 is updated by the signals pBLKSELr and pBLKSEL1, only one of which will pulse at the beginning of the bank activation.

For example, if the left bank was previously active, then ISOL was high and ISOr was low. Accordingly, output 168 was low (buffer 164 is an inverting buffer) and output 170 was high. During the following pre-charge operation, the flip-flop 150 remains in the previous state and pre-charge occurs from the left side. During the following bank activation, one of the two inputs at 176 and 178 will pulse high. If input 178 pulses high (indicating a left bank activation), then output 170 remains high, output 168 remains low and ISOL and ISOr remain high and low respectively.

However, if the activation command selects the right bank then input 176 pulses high and output 170 switches low while output 168 switches high. This change of state of the flip-flop 150 reverses the states of ISOL and ISOr to low and high respectively. The prior art design for the corresponding circuit to control the isolation transistors requires additional circuitry and an additional input. The additional input is needed so that the state of flip-flop 150 can be switched after the non-pre-charge side has been active to pre-charge from the predefined pre-charge side. The present invention not only has the benefits of eliminating the equalization problem and one timing even, it also has the advantage of eliminating this extra input and control circuitry for the flip-flop 150.

Those of skill in the art will recognize that the flip-flop 150 may be designed with a single input having alternating states according to which bank is active and may also be designed in other ways which do not employ nand gates or which do not use inverted buffers.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A pre-charge circuit for a memory device having a sense amplifier shared between a right bank during row operations to the right bank and a left bank during row operations to the left bank, the pre-charge circuit comprising:

a right bank isolation transistor pair connected between the sense amplifier and the right bank;

a left bank isolation transistor pair connected between the sense amplifier and the left bank;

a right bank isolation control line having an on state for turning on the right bank isolation transistor pair to connect the sense amplifier to the right bank, and an off state for turning off the right bank isolation transistor pair to disconnect the sense amplifier from the right bank;

a left bank isolation control line having an on state for turning on the left bank isolation transistor pair to connect the sense amplifier to the left bank, and an off state for turning off the left bank isolation transistor pair to disconnect the sense amplifier from the left bank; and a flip-flop switchable between a right bank state and a left bank state, the flip-flop including:

a right bank isolation output connected to the right bank isolation control line, the right bank isolation output being in the on state and turning on the right bank isolation transistor pair when the flip-flop is in the right bank state and the right bank isolation output being in the off state and turning off the right bank isolation transistor pair when the flip-flop is in the left bank state; and a left bank isolation output connected to the left bank isolation control line, the left bank isolation output being in the on state and turning on the left bank isolation transistor pair when the flip-flop is in the left bank state and the left bank isolation output being in the off state and turning off the left bank isolation transistor pair when the flip-flop is in the right bank state;

the memory device switching the flip-flop to the right bank state prior to right bank row operations and to the left bank state prior to left bank row operations, the flip-flop remaining in the right bank state to pre-charge the sense amplifier from the right bank after right bank row operations and remaining in the left bank state to pro-charge the sense amplifier from the left bank after left bank row operations, wherein the flip-flop maintains the state of said isolation transistor pairs while said left and right banks select signals are low, allowing pre-charging the bit lines in the absence of the bank select signals.

2. The pre-charge circuit for a memory device according to claim 1 wherein the flip-flop includes first and second inputs, the flip-flop entering the right bank state upon receiving a control signal on the first input and the flip-flop entering the left bank state upon receiving a control signal on the second input.

3. The pre-charge circuit for a memory device according to claim 2 wherein the first and second inputs are connected to control lines for selecting the right and left banks during row operations to the right and left banks, respectively.

4. The pre-charge circuit for a memory device according to claim 2 further including first and second input buffers connected to the first and second inputs of the flip-flop.

5. The pre-charge circuit for a memory device according to claim 1 wherein the flip-flop comprises a pair of nand gates.

6. The pre-charge circuit for a memory device according to claim 1 further including output buffers connected between the flip-flop isolation outputs and the isolation control lines.

7. The pre-charge circuit for a memory device according to claim 6 wherein the output buffers connected between the flip-flop isolation outputs and the isolation control lines are inverting output buffers.

8. The pre-charge circuit for a memory device according to claim 1 further including at least one input buffer connected to at least one input to control the flip-flop and a pair of output buffers connected between the flip-flop outputs and the isolation control lines.

9. The pre-charge circuit for a memory device according to claim 1 wherein the flip-flop does not include an input providing a signal indicating the beginning of a pre-charge operation.

10. A method of pre-charging a sense amplifier shared between a right bank during row operations to the right bank and a left bank during row operations to the left bank, the method comprising the steps of;

providing a right bank isolation transistor pair connected between the sense amplifier and the right bank;

providing a left bank isolation transistor pair connected between the sense amplifier and the left bank;

providing a right bank isolation control line having an on state for turning on the right bank isolation transistor pair to connect the sense amplifier to the right bank, and an off state for turning off the right bank isolation transistor pair to disconnect the sense amplifier from the right bank;

providing a left bank isolation control line having an on state for turning on the left bank isolation transistor pair to connect the sense amplifier to the left bank, and an off state for turning off the left bank isolation transistor pair to disconnect the sense amplifier from the left bank; and providing a flip-flop switchable between a right bank state and a left bank state, the flip-flop including;

a right bank isolation output connected to the right bank isolation control line, the right bank isolation output being in the on state and turning on the right bank isolation transistor pair when the flip-flop is in the right bank state and the right bank isolation output being in the off state and turning off the right bank isolation transistor pair when the flip-flop is in the left bank state; and a left bank isolation output connected to the left bank isolation control line, the left bank isolation output being in the on state and turning on the left bank isolation transistor pair when the flip-flop is in the left bank state and the left bank isolation output being in the off state and turning off the left bank isolation transistor pair when the flip-flop is in the right bank state; and having the memory device switch the flip-flop to the right bank state prior to the right bank row operations and to the left bank state prior to the left bank row operations, the flip-flop remaining in the right bank state to pre-charge the sense amplifier from the right bank after right bank row operations and remaining in the left bank state to pre-charge the sense amplifier from the left bank after left bank row operations, wherein the flip-flop maintains the state of said isolation transistor pairs while the left and right banks select signals are low, allowing pre-charging the bit lines in the absence of the bank select signals.

11. The method of pre-charging a sense amplifier according to claim 10 wherein the step of providing a flip-flop includes the step of providing buffers at inputs of the flip-flop.

12. The method of pre-charging a sense amplifier according to claim 10 wherein the step of providing a flip-flop includes the step of providing buffers at outputs of the flip-flop.

13. The method of pre-charging a sense amplifier according to claim 12 wherein the step of providing buffers at outputs of the flip-flop includes the step of providing inverting buffers at the outputs of the flip-flop.

* * * * *